(12) United States Patent
Lee

(10) Patent No.: US 9,281,316 B2
(45) Date of Patent: Mar. 8, 2016

(54) SEMICONDUCTOR DEVICE AND METHOD OF MANUFACTURING THE SAME

(71) Applicant: SK hynix Inc., Icheon-si Gyeonggi-do (KR)

(72) Inventor: Sang Soo Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 3 days.

(21) Appl. No.: 14/167,535

(22) Filed: Jan. 29, 2014

(65) Prior Publication Data

US 2015/0069484 A1 Mar. 12, 2015

(30) Foreign Application Priority Data

Sep. 10, 2013 (KR) .......................... 10-2013-0108570

(51) Int. Cl.
*H01L 29/76* (2006.01)
*H01L 27/115* (2006.01)
*H01L 29/66* (2006.01)
*H01L 29/792* (2006.01)

(52) U.S. Cl.
CPC .... *H01L 27/11582* (2013.01); *H01L 29/66833* (2013.01); *H01L 29/7926* (2013.01)

(58) Field of Classification Search
USPC .......................... 257/314, 324, 775; 438/667
See application file for complete search history.

(56) References Cited

U.S. PATENT DOCUMENTS

2010/0109065 A1* 5/2010 Oh et al. ........................ 257/314
2011/0309431 A1* 12/2011 Kidoh et al. .................. 257/324

FOREIGN PATENT DOCUMENTS

KR 1020110070143 A 6/2011

OTHER PUBLICATIONS

Merriam-Webster's Dictionary definition—"hole".*
Merriam-Webster's Dictionary definition—"slit".*

* cited by examiner

*Primary Examiner* — Errol Fernandes
(74) *Attorney, Agent, or Firm* — William Park & Associates Ltd.

(57) ABSTRACT

A semiconductor device includes stacked groups each including interlayer insulating patterns and conductive patterns and stacked in at least two tiers, wherein the insulating patterns and the conductive patterns are alternately stacked over a substrate and separated by slits, and a support body including holes and formed between the stacked groups.

15 Claims, 16 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2013-0108570 filed on Sep. 10, 2013, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a three-dimensional semiconductor device and a method of manufacturing the same.

2. Related Art

A three-dimensional (3D) semiconductor device includes memory cells that are stacked in a plurality of layers. The 3D semiconductor device may increase a degree of integration as compared to a two-dimensional semiconductor device that includes memory cells arranged in a single layer over a substrate.

A three-dimensional semiconductor device may include a stacked structure that is separated by a slit. The stacked structure may include conductive patterns and insulating patterns that are alternately stacked over a substrate. In order to increase the degree of integration of the 3D semiconductor device, the number of memory cells, which are stacked over the substrate, may be increased. As the number of memory cells stacked increases, the number of conductive patterns and insulating patterns that constitute the stacked structure may also increase. However, when the slit is formed in order to separate the stacked structure, the stacked structure may lean due to a high aspect ratio of the stacked structure. As a result, it may be difficult to ensure reliability of the 3D semiconductor device, and manufacturing processes thereof may become difficult.

In accordance with an embodiment of the present invention, a memory system comprises: a memory controller; and a memory device coupled to the memory controller, wherein the memory device comprises: stacked groups each including interlayer insulating patterns and conductive patterns and stacked in at least two tiers, wherein the insulating patterns and the conductive patterns are alternately stacked over a substrate and separated by slits; and a support body including holes is formed between the stacked groups.

BRIEF SUMMARY

Various embodiments relate to a semiconductor memory device having increased reliability and allowing for easy manufacture and a method of manufacturing the same.

A semiconductor device according to an embodiment of the present invention may include stacked groups each including interlayer insulating patterns and conductive patterns and stacked in at least two tiers, wherein the insulating patterns and the conductive patterns are alternately stacked over a substrate and separated by slits, and a support body including holes and formed between the stacked groups.

A method of manufacturing a semiconductor device according to an embodiment of the present invention may include alternately stacking first material layers and second material layers, forming a first slit passing through the first material layers and the second material layers, forming a third material layer filling the first slit, and forming a support body, fourth material layers and fifth material layers over the first to third material layers, wherein holes are formed through the support body, the fourth material layers and the fifth material layers are alternately stacked over the support body, and a second slit is formed through the fourth material layers and the fifth material layers.

DETAILED DESCRIPTION

Figure 1:
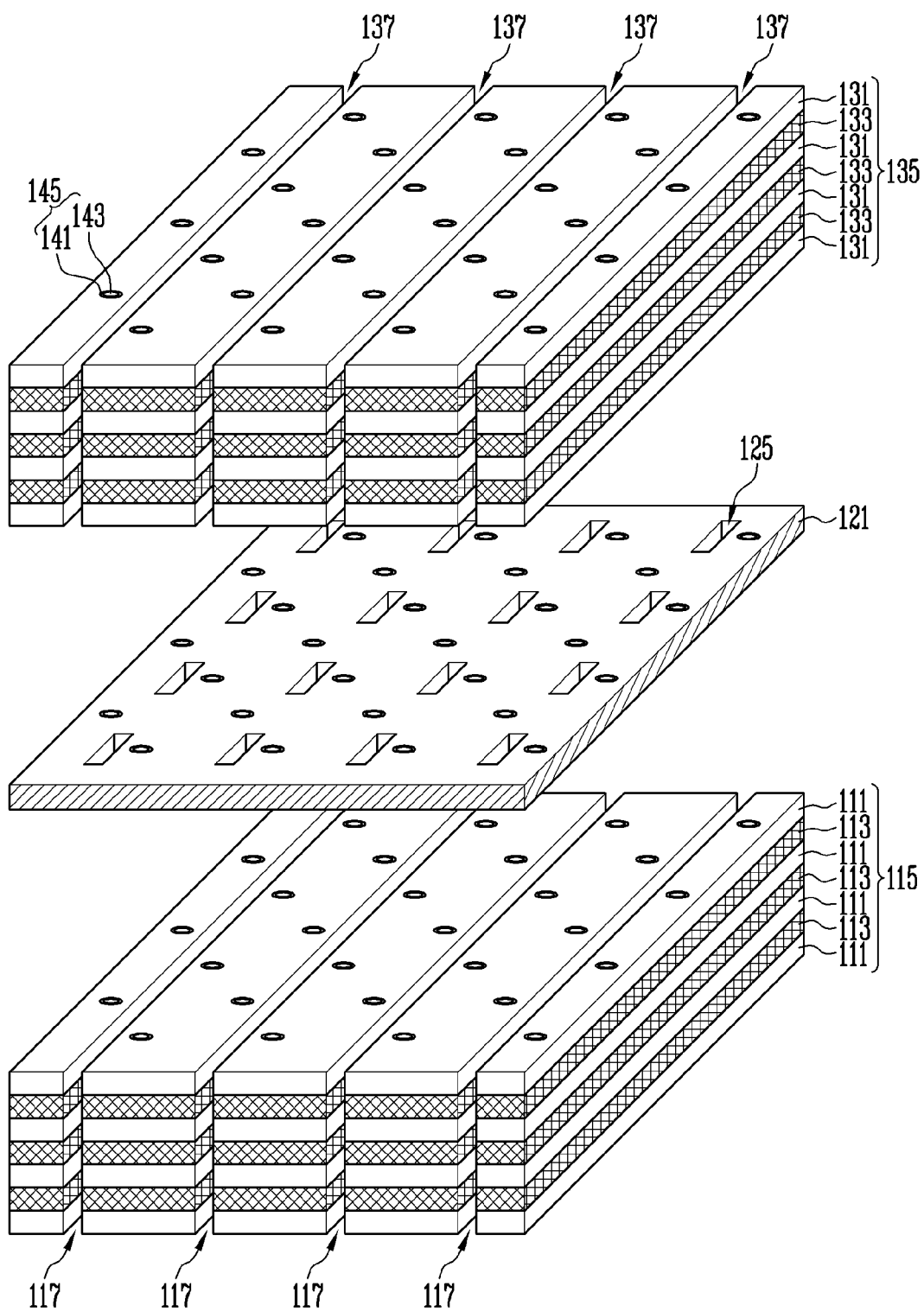
FIG. 1 is an exploded perspective view illustrating a semiconductor device according to an embodiment of the present invention.

Hereinafter, various embodiments of the present invention will be described with reference to the accompanying drawings. In the drawings, the thicknesses and distances between the components are exaggerated compared to an actual physical thickness and interval for the convenience of illustration. In the following description, detailed explanation of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is an exploded perspective view illustrating a semiconductor device according to an embodiment of the present invention. In FIG. 1, an insulating layer that fills slits 137 and holes 125 in a support body 121 are not shown for illustrative purposes.

Referring to FIG. 1, a semiconductor device according to an embodiment of the present invention may include first and second stacked groups, the support body 121 and penetrating structures 145. The first and second stacked groups may include first and second stacked structures 115 and 135, respectively, be stacked over a substrate (not illustrated) and be arranged in at least two tiers. The support body 121 may be interposed between the first and second stacked groups. The penetrating structures 145 may pass through the first and second stacked structures 115 and 135 and the support body 121. The first stacked structure 115 may include first interlayer insulating patterns 111 and first conductive patterns 131 that are stacked alternately with each other. The second stacked structure 135 may include second interlayer insulating patterns 113 and second conductive patterns 133 that are stacked alternately with each other. The first and second stacked structures 115 and 135 in the same tier may be separated by first and second slits 117 and 137, respectively. Hereinafter, a semiconductor device according to an embodiment of the present invention is described below in detail in reference to an example in which the first and second stacked groups include the first and second stacked structure 115 and 135, respectively, and are arranged in two tiers.

Each of the first stacked structures 115 may include the first interlayer insulating patterns 111 and the first conductive patterns 113 that are stacked alternately with each other. The first slits 117 that define boundaries between the first stacked structures 115 may extend through the first interlayer insulating patterns 111 and the first conductive patterns 113. Each of the first interlayer insulating patterns 111 may be arranged on each of the uppermost layers of the first stacked structures 115 adjacent to the support body 121.

Each of the second stacked structures 135 may include the second interlayer insulating patterns 131 and the second conductive patterns 133 that are stacked alternately with each other. The second slits 137 that define boundaries between the second stacked structures 135 may be formed through the second interlayer insulating patterns 131 and the second conductive patterns 133. The second slits 137 may extend in a direction in which the first slits 117 extend and overlap the first slits 117. Each of the second interlayer insulating patterns 131 may be arranged on each of the lowermost layers of the second stacked structures 135 adjacent to the support body 121.

The first and second conductive patterns 113 and 133 may function as word lines coupled to memory cells or selection lines coupled to selection transistors. Though not illustrated in FIG. 1, contact plugs that are coupled to signal wiring to which external signals are applied may be coupled to the first and second conductive patterns 113 and 133, so that the external signals may be applied during operations of the semiconductor device.

The support body 121 may be located between the first stacked structures 115 and the second stacked structures 135 so that the first slits 117 and the second slits 137 may not directly contact each other. The support body 121 may include holes 125 that are separated from each other in the direction in which the first and second slits 117 and 137 extend and may overlap the first and second slits 117 and 137. For example, the support body 121 may be formed in a mesh pattern. The support body 121 may include any one of a conductive layer, a silicon oxide layer and a silicon nitride layer. Examples of a conductive layer which is configured as the support body 121 may include undoped poly silicon, doped poly silicon and the like.

Though not illustrated in FIG. 1, the first and second conductive patterns 113 and 133 and the support body 121 may be patterned stepwise. In this example, contact plugs may be coupled to the first and second conductive patterns 113 and 133 and the support body 121. The contact plugs may have various heights depending on positions of the first and second conductive patterns 113 and 133 and the support body 121. Unlike described above, when the support body 121 remains as an isolated pattern, the contact plugs may not be coupled to the support body 121.

As described above, according to an embodiment of the present invention, the first and second slits 117 and 137 may not be directly coupled to each other and may be coupled through the holes 125 while interposing the support body 121 including the holes 125 therebetween. Therefore, as compared to a case in which the first and second slits 117 and 137 are directly coupled to each other, a stacked structure of a semiconductor device may be prevented from leaning in an embodiment of the present invention. As a result, reliability of the semiconductor device may be improved.

The penetrating structures 145 may be formed through the second stacked structure 135, the support body 121 and the first stacked structure 115. The penetrating structures 145 may be arranged in a longitudinal direction of the first and second stacked structure 115 and 135. The penetrating structures 145 may be arranged in a single row or in a zigzag pattern in the longitudinal direction of the first and second stacked structure 115 and 135. The penetrating structures 145 may include channel layers 143. Each of the channel layers 143 may pass through the second stacked structure 135, the support body 121 and the first stacked structure 115. The channel layer 143 may provide a channel region of the memory cells and the selection transistors. The penetrating structures 145 may further include thin films 141. Each of the thin films 141 may surround each of the channel layers 143. Though not illustrated in FIG. 1, the thin film 141 may be formed along top and bottom surfaces of the first conductive pattern 113 and a sidewall thereof contacting the channel layer 143. In addition, the thin film 141 may be formed along top and bottom surfaces of the second conductive pattern 133 and a sidewall thereof contacting the channel layer 143. The thin film 141 may have a single layer structure including a tunnel insulating layer, a dual layer structure including the tunnel insulating layer and a data storage layer surrounding the tunnel insulating layer, or a triple structure including the tunnel insulating layer, the data storage layer surrounding the tunnel insulating layer and a blocking insulating layer surrounding the data storage layer.

The memory cells and the selection transistors may be defined at intersections between the first and second conductive patterns 113 and 133 and the channel layer 143. Therefore, the semiconductor device according to an embodiment of the present invention may have a three-dimensional structure in which the memory cells are stacked along the channel layer 143. When a contact plug is coupled to the support body 121 including a conductive layer, current may smoothly flow in the channel layer 143 during a program or erase operation of the semiconductor device by applying a bias voltage to the support body 121 through the contact plug.

FIGS. 2A to 2H are perspective views illustrating a method of manufacturing a semiconductor device according to an embodiment of the present invention.

Figure 2A:
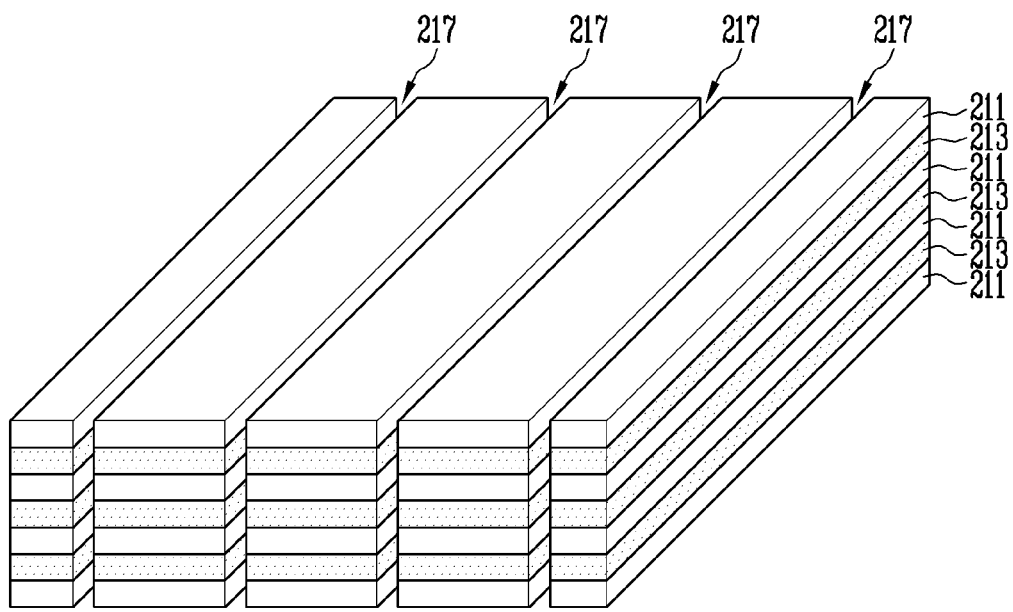
FIGS. 2A to 2H are perspective views illustrating a method of manufacturing a semiconductor device according to a an embodiment of the present invention.

Referring to FIG. 2A, first material layers 211 and second material layers 213 may be alternately formed over a substrate (not illustrated). The first material layers 211 may include an insulating pattern material, and the second material layers 213 may include a sacrificial material having a different etch selectivity from the insulating pattern material. For example, the first material layers 211 may include a silicon oxide layer, and the second material layers 213 may include a silicon nitride layer.

Subsequently, first slits 217 may be formed through the first and second material layers 211 and 213 so as to separate the first and second material layers 211 and 213 into first preliminary stacked structures. Sidewalls of the first and second material layers 211 and 213 may be exposed through the first slits 217.

Figure 2B:
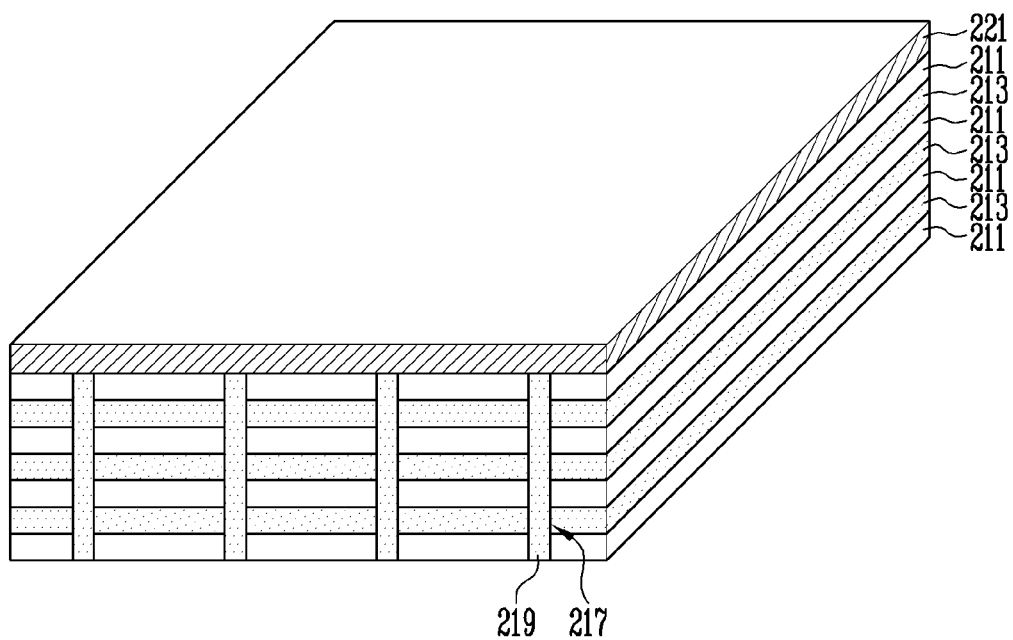

Referring to FIG. 2B, the first slits 217 may be filled with third material layers 219. The third material layers 219 may include a material having a different etch selectivity from the first material layers 211 and a support body material layer 221 to be formed subsequently. More specifically, the third material layers 219 may include the same material as the second material layers 213 or include different materials from the second material layers 213. For example, the third material layers 219 may include a silicon nitride layer or TiN.

Subsequently, the support body material layer 221 may be formed over the first to third material layers 211, 213 and 219. The support body material layer 221 may include different materials from the first to third material layers 211, 213 and 219. For example, the support body material layer 221 may include a conductive layer, such as an undoped polysilicon layer or a doped polysilicon layer.

Figure 2C:
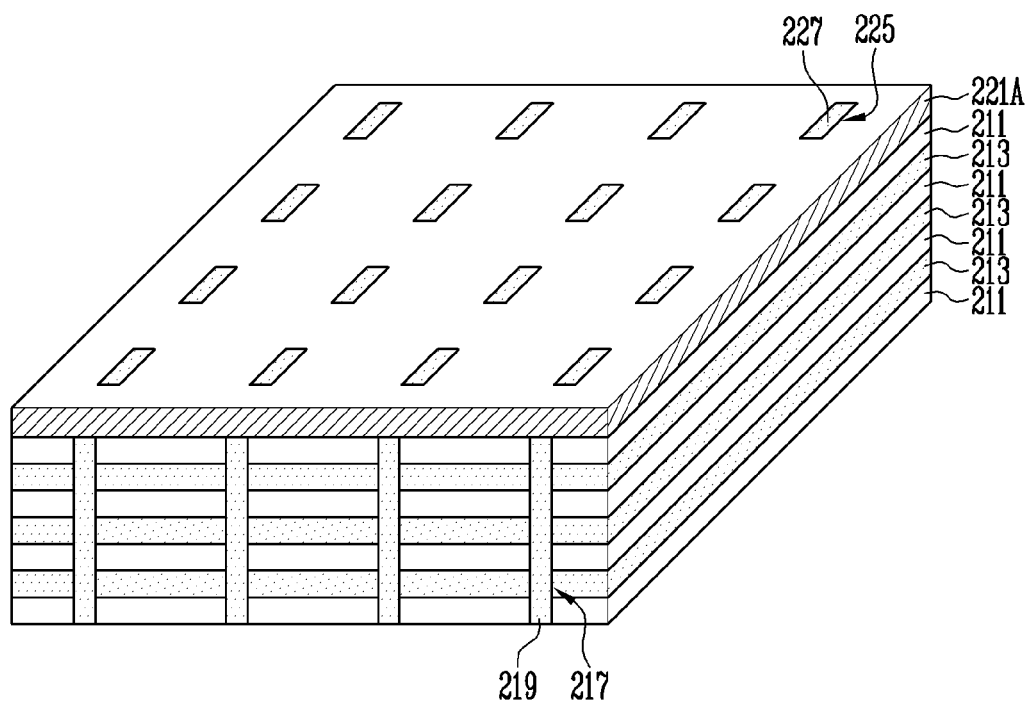

Referring to FIG. 2C, holes 225 may be formed by patterning the support body material layer 221 such that the holes 225 may be arranged along the first slits 217. As a result, a support body 221A that includes the holes 225 may be formed, and the holes 225 may be arranged along the first slits 217 and overlap the first slits 217.

Thereafter, the holes 225 may be filled with hole-filling material layers 227 that may be substantially the same as the third material layer 219. The hole-filling material layers 227 may include a material having a different etch selectivity from the first material layers 211 and the support body material layer 221. More specifically, the hole-filling material layers 227 may include the same material as the second material layers 213 or different materials from the second material layers 213. For example, the hole-filling material layers 227 may include a silicon nitride layer or TiN.

Referring to 2D, fourth material layers 231 and fifth material layers 233 may be alternately formed over the support body 221A that includes the holes 225 filled with the hole-filling material layers 227. The fourth material layers 231 may include an insulating pattern material as in the first material layers 211. Like the second material layers 213, the fifth material layers 233 may include a sacrificial material having a different etch selectivity from the insulating pattern material. More specifically, the fourth material layers 231 may include a silicon oxide layer, and the fifth material layers 233 may include a silicon nitride layer.

Subsequently, an etch barrier pattern 235 that includes opening holes 236 may be formed over the fourth material layers 231 and the fifth material layers 233. The etch barrier pattern 235 may be a photoresist pattern or be formed by patterning a material layer having an etch selectivity with respect to the fourth and fifth material layers 231 and 233 by using a photolithography process.

The fourth and fifth material layers 231 and 233, which are exposed through the opening holes 236, may be etched using the etch barrier pattern 235 and an etch mask. Thus, first channel holes 239A may be formed through the fourth and fifth material layers 231 and 233 so that the support body 221A may be opened through the first channel holes 239A. The support body 221A may be used as an etch stop layer during an etch process for forming the first channel holes 239A. The first channel holes 239A and the holes 225 of the support body 221A and the first slits 217 may not overlap each other and may be offset from each other.

Figure 2D:
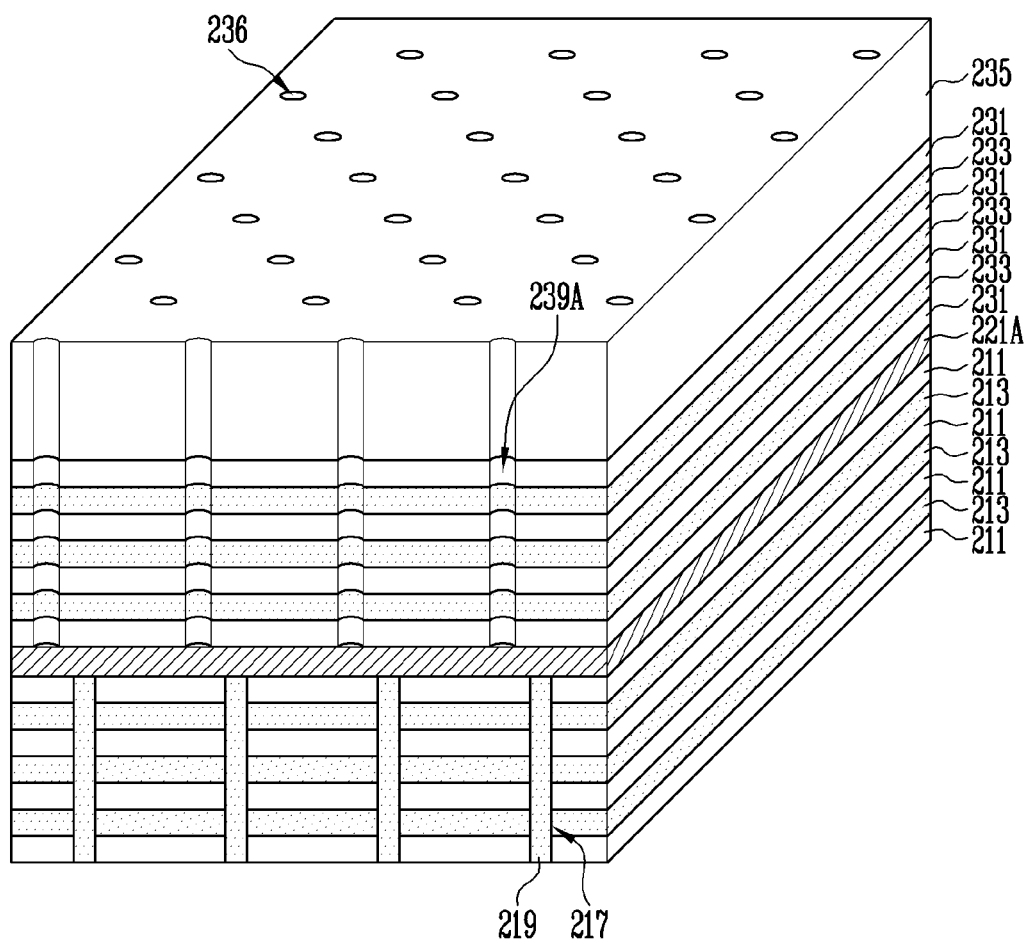
Figure 2E:
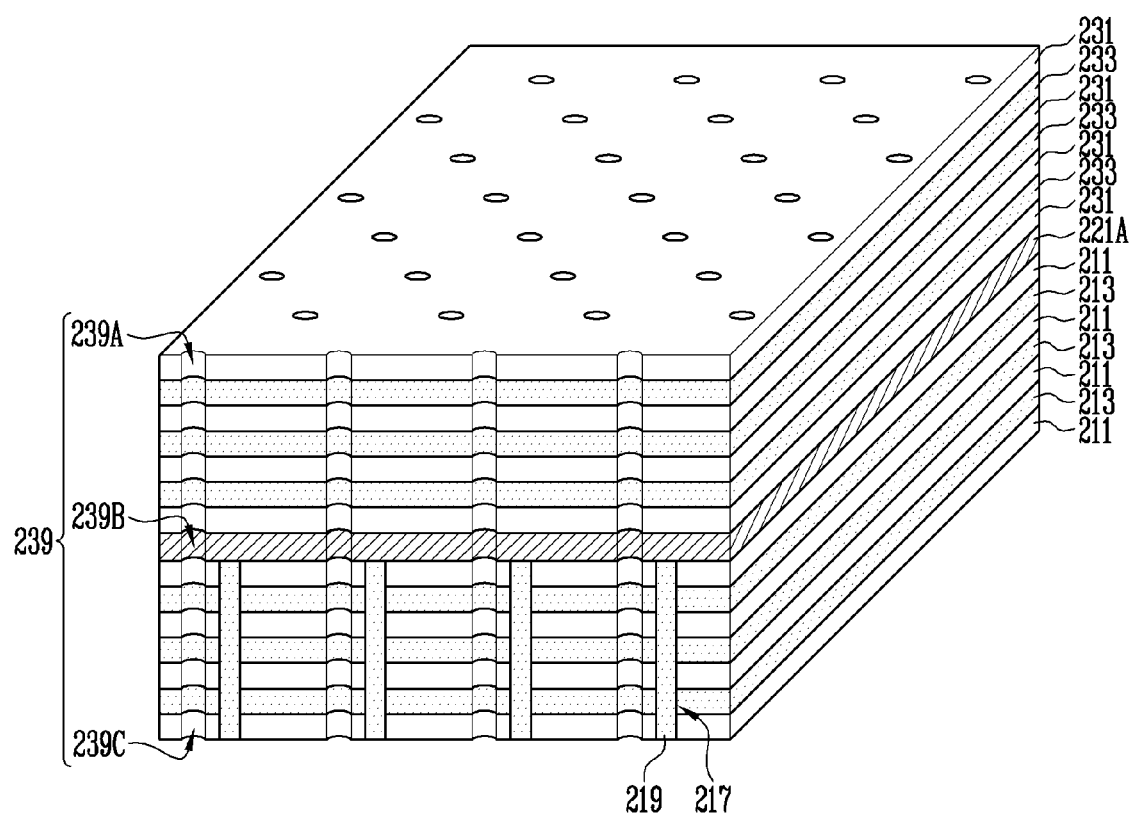

Referring to FIG. 2E, second channel holes 239B may be formed through the support body 221A by etching the support body 221A opened through the first channel holes 239A. Subsequently, third channel holes 239C may be formed through the first and second material layers 211 and 213 by etching the first and second material layers 211 and 213 through the second channel holes 239B. Thus, through holes 239 may be formed in which the first channel holes 239A, the second channel holes 239B coupled to the first channel holes 239A and the third channel holes 239C coupled to the second channel holes 239B are included. Each of the first to third channel holes 239A, 239B and 239C may have various cross-sectional shapes such as a circle, oval, or polygon. After the through holes 239 are formed, the etch barrier pattern 235 may be removed.

As described, according to an embodiment of the present invention, the etch process for forming the through holes 239 may include an etch process for forming the first channel holes 239A, an etch process for forming the second channel holes 239B and an etch process for forming the third channel holes 239C. Therefore, according to an embodiment of the present invention, uniformity of upper and lower widths of the through holes 239 may be increased.

The first to third channel holes 239A, 239B and 239C may be formed using the same etching material or through a single etch process by using different etching materials in a single chamber.

Figure 2F:
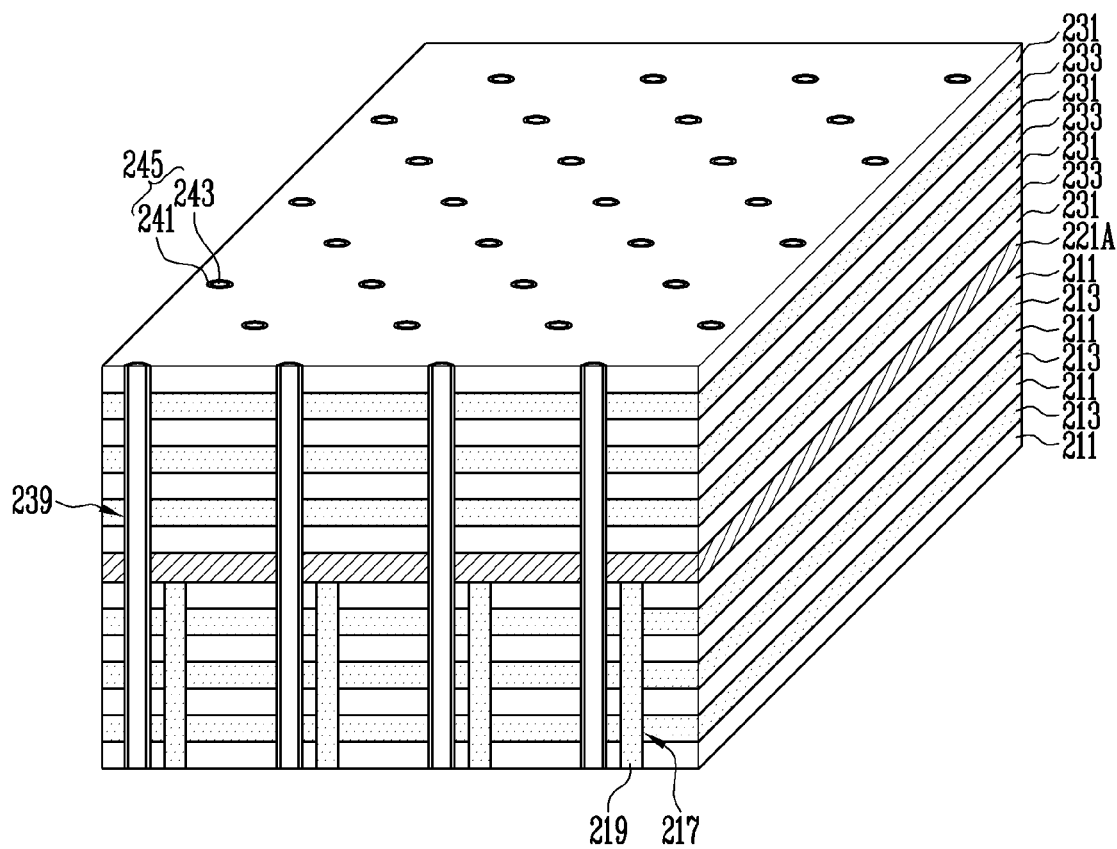

Referring to FIG. 2F, penetrating structures 245 may be formed in the respective through holes 239. The penetrating structures 245 may include channel layers 243. For example, the channel layers 243 may be formed by filling the through holes 239 with semiconductor layers such as silicon. In another example, the channel layer 243 may be formed by providing a semiconductor layer so as to open a central portion of the through hole and subsequently filling the central portion of the through hole 239 with the insulating material.

The penetrating structures 245 may further include thin films 241, each of which may surround each of the channel layers 243. Each of the thin films 241 may be further formed along a surface of the through hole 239 before the channel layer 243 is formed. As described above, the thin film 241 may have a single layer structure including a tunnel insulating layer, a dual layer structure including the tunnel insulating layer and a data storage layer surrounding the tunnel insulating layer, or a triple structure including the tunnel insulating layer, the data storage layer surrounding the tunnel insulating layer and a blocking insulating layer surrounding the data storage layer. The tunnel insulating layer may include a silicon oxide layer, the data storage layer may include a silicon nitride layer capable of trapping charges, and the blocking insulating layer may include an oxide layer.

Figure 2G:
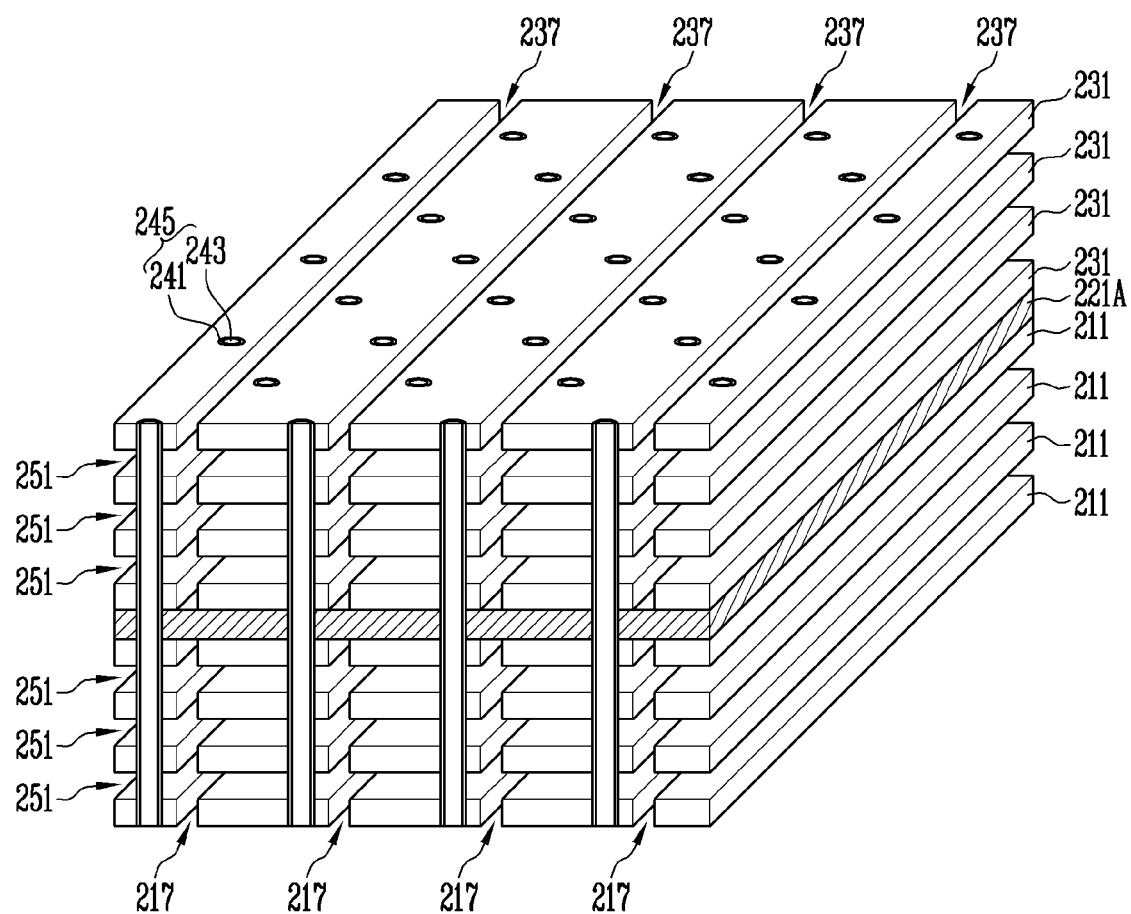

Referring to FIG. 2G, the fourth material layers 231 and the fifth material layers 233, shown in FIG. 2F, may be etched. Thus, second slits 237 may be formed so that the second slits 237 are arranged along the first slits 217 and overlap the first slits 217. The fourth and fifth material layers 231 and 233 may be separated into second preliminary stacked structures through the second slits 237. The hole-filling material layers 227, shown in FIG. 2C, which are used to fill the holes 225, shown in FIG. 2C, formed in the support body 221A may be opened through the second slits 237.

Subsequently, the holes 225 and the first slits 237 may be opened by selectively removing the hole-filling material layers 227 and the third material layers 219, shown in FIG. 2C. Subsequently, recessed regions 251 may be formed by removing the second and fifth material layers 213 and 233, shown in FIG. 2F. When the hole-filling material layers 227 and the third material layers 219 include the same sacrificial material as the second and fifth material layers 213 and 233, a process of opening the holes 225 and the first slits 237 and a process of forming the recessed regions 251 may be performed using the same etch process.

As described above, the process of forming the second slits 237, the process of opening the holes 225 and the process of opening the first slits 237 may be performed using different etch processes or a single etch process using the same etching material.

The support body 221A may prevent the first and second material layers 211 and 213 and the fourth and fifth material layers 231 and 233 from leaning since an aspect ratio is increased by the first and second slits 217 and 237 when the third material layers 219 are removed. More specifically, according to an embodiment of the present invention, since the support body 221A is arranged between the first and second slits 217 and 237, an aspect ratio of the first and second material layers 211 and 213 under the support body 221A and an aspect ratio of the fourth and fifth material layers 231 and 233 over the support body 221A are separated from each other, so that leaning may be prevented.

Figure 2H:
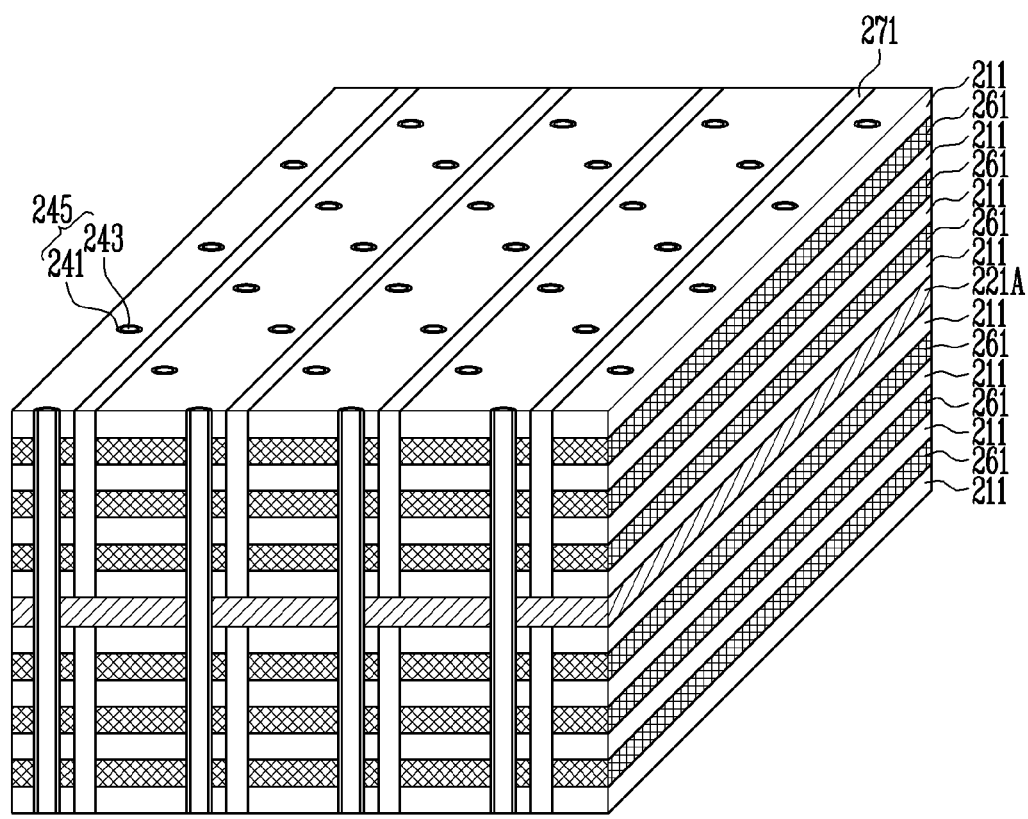

Referring to FIG. 2H, conductive patterns 261 may be formed by filling the recessed regions 251 with conductive materials.

In order to form the conductive patterns 261, first, conductive materials, such as a doped polysilicon layer, a metal layer, or a metal silicide layer may be formed so that the recessed regions 251 may be filled with the conductive materials. The conductive materials may further include a barrier metal layer. Subsequently, the conductive patterns 261 may remain in the recessed regions 251 by removing the conductive materials formed in the first and second slits 217 and 237, shown in FIG. 2G, and the conductive materials, formed on an upper surface or a lower surface of the support body 221A.

Before the conductive patterns 261 are formed, the thin films 241, shown in FIG. 2F, may be further formed along surfaces of the recessed regions 251.

Subsequently, an insulating structure 271 may be formed by filling the first and second slits 217 and 237 and the holes 225, shown in FIG. 2C, with an insulating material.

Figure 3:
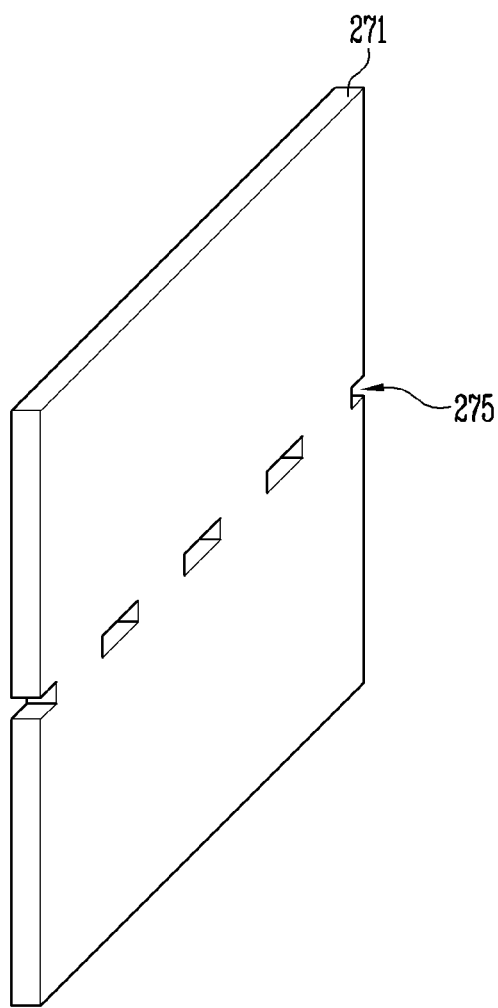
FIG. 3 is a perspective view illustrating an insulating structure shown in FIG. 2H.

FIG. 3 is a perspective view illustrating the insulating structure shown in FIG. 2H.

Referring to FIG. 3, the insulating structure 271 may have a plate type structure including holes through which the support body 221A, shown in FIG. 2H, passes.

Figure 4:
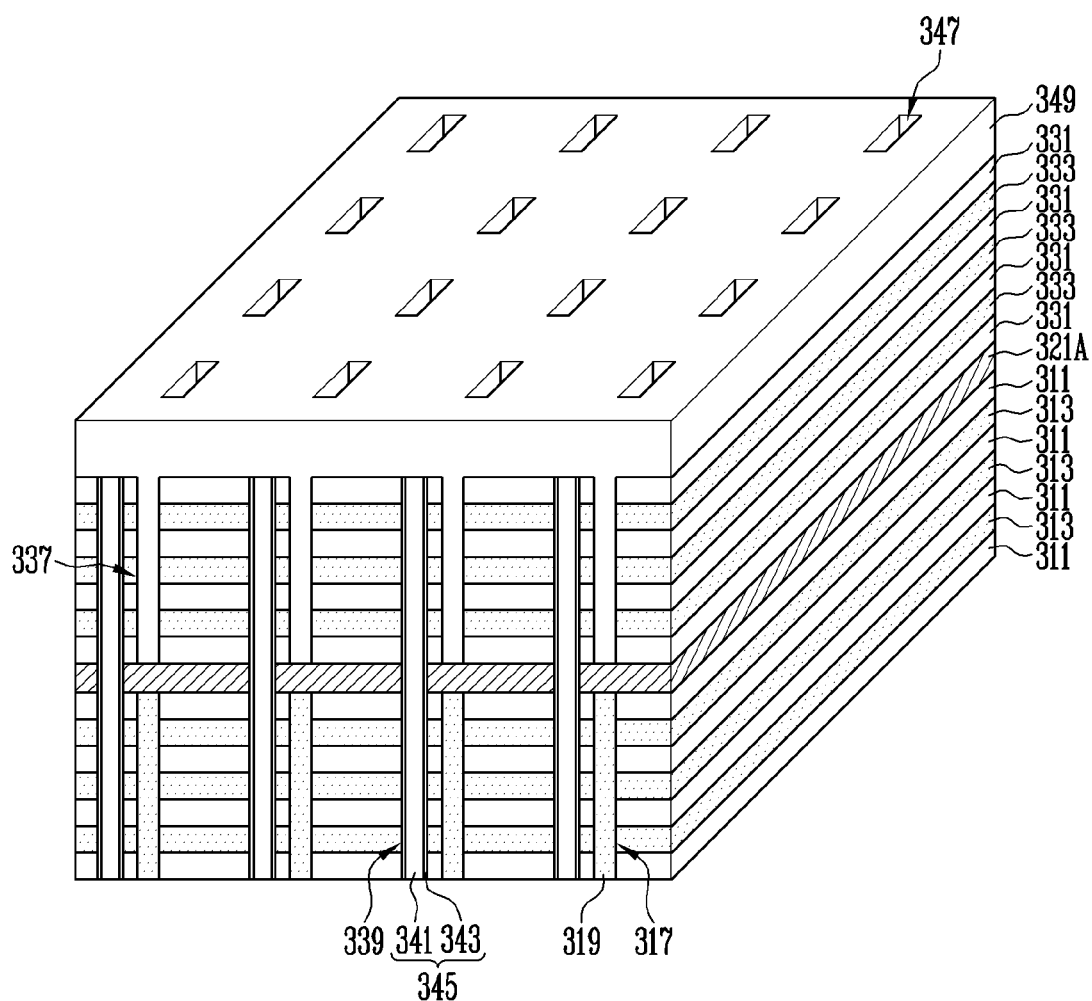
FIG. 4 is a perspective view illustrating a method of manufacturing a semiconductor device according to an embodiment of the present invention.

FIG. 4 is a perspective view illustrating a method of manufacturing a semiconductor device according to an embodiment of the present invention.

Referring to FIG. 4, first material layers 311 and second material layers 313 may be alternately formed, and first slits 317 may be formed therein, like the embodiment described with reference to FIG. 2A. Subsequently, the first slits 317 may be filled with third material layers 319, and a support body material layer may be formed thereon, like the embodiment of the present invention described with reference to 2B.

Subsequently, before the support body material layer is patterned, fourth material layers 331 and fifth material layers 333 may be alternately formed over the support body material layer. Compositions of the fourth and fifth material layers 331 and 333 may be substantially the same as those described with reference to FIG. 2D.

Subsequently, by substantially the same method described with reference to FIGS. 2D to 2F, through holes 339 and penetrating structures 345 may be formed such that the penetrating structures 345 may include channel layers 343 and thin films 341. In addition, in substantially the same manner as described above with reference to FIG. 2G, second slits 337 may be formed. In an embodiment of the present invention, the support body material layer may be opened through the second slits 337.

Subsequently, an etch barrier pattern 349 that includes opening holes 347 through which portions of the support body material layer are opened may be formed over an intermediate resultant structure in which the second slits 337 are formed. The etch barrier pattern 349 may include a photoresist pattern or may be formed by patterning an etch barrier layer, which includes a different material from a photoresist material, using a photolithography process. The opening holes 347 of the etch barrier pattern 349 may be arranged along the second slits 337.

Subsequently, a support body 321A may be formed by etching the support body material layer 221 during an etch process using the etch barrier pattern 349 as a barrier. The support body 321A may include holes corresponding to the opening holes 347. The holes of the support body 321A may overlap the first slits 317 and open the third material layers 319 in substantially the same manner as described above with reference to FIG. 2C.

Thereafter, though not illustrated in FIG. 4, the etch barrier pattern 349 may be removed and recessed regions may be formed by removing the third material layers 319 and the second and fifth material layers 313 and 333 in substantially the same manner as shown in FIG. 2G. The same subsequent processes as described above with reference to FIG. 2H may be performed.

Figure 5A:
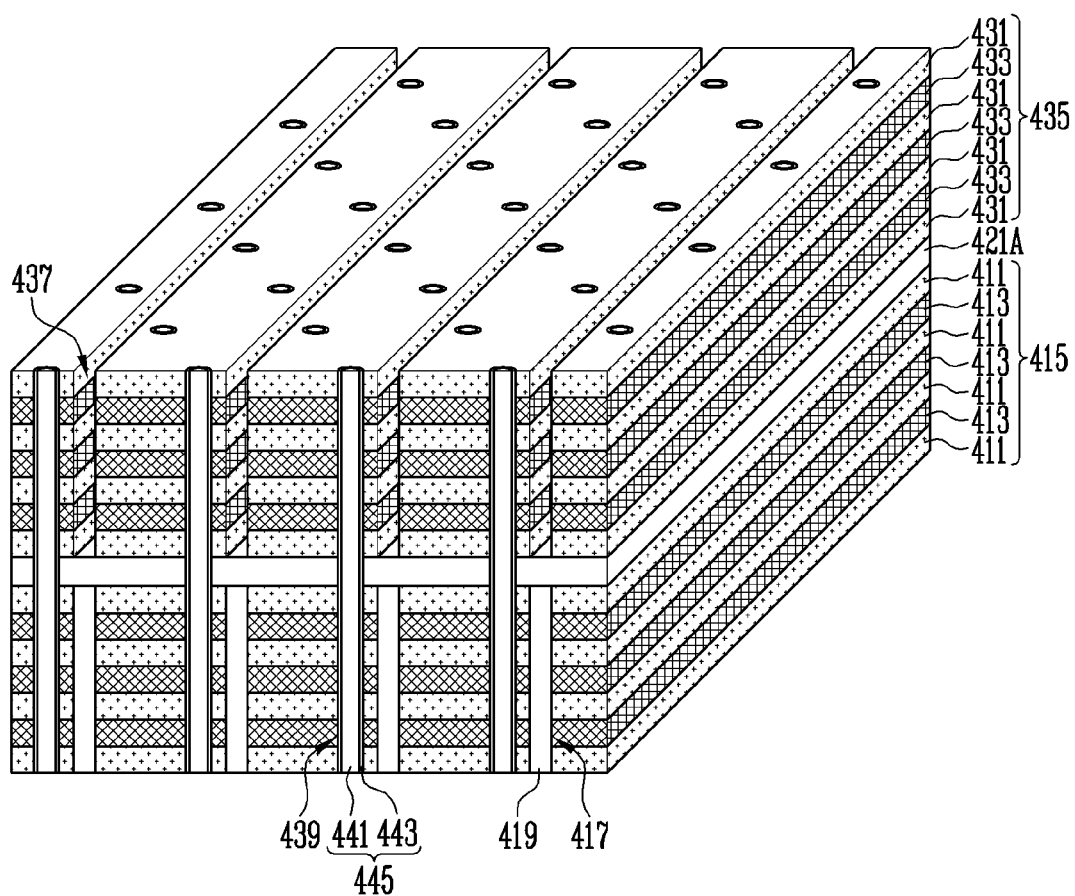
FIGS. 5A and 5B are perspective views illustrating a method of manufacturing a semiconductor device according to an embodiment of the present invention.
Figure 5B:
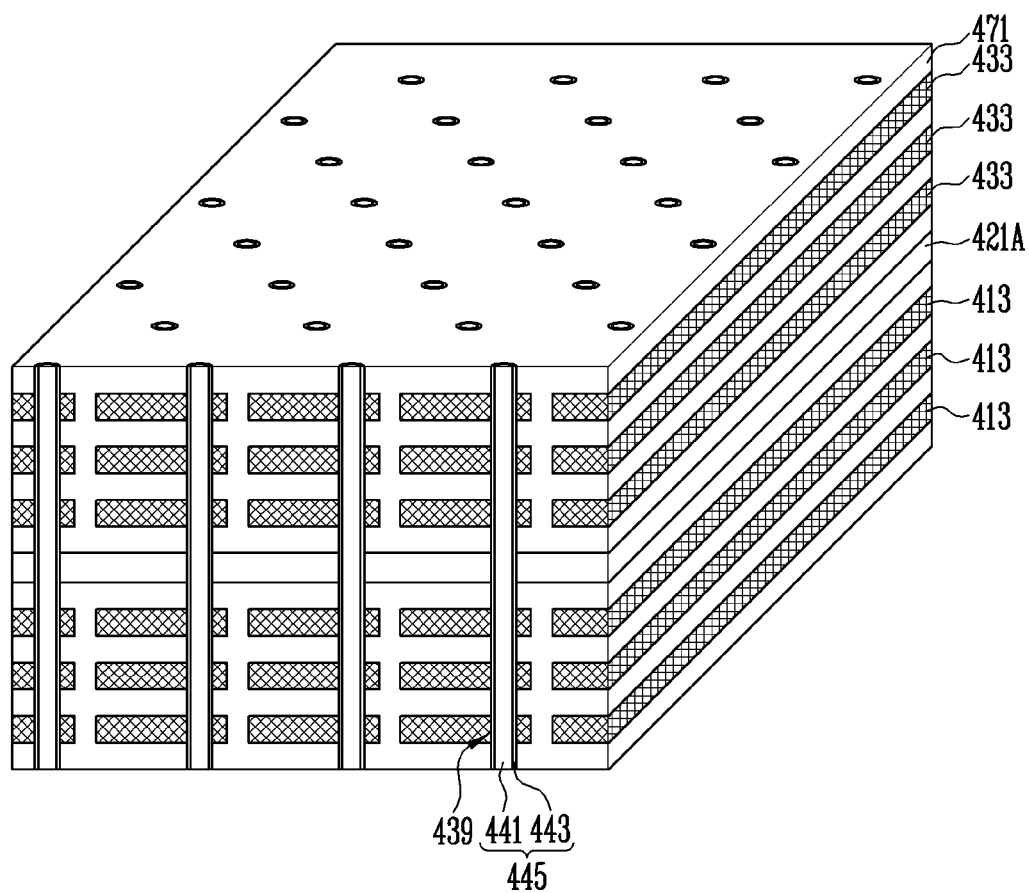

FIGS. 5A and 5B perspective views illustrating a method of manufacturing a semiconductor device according to an embodiment of the present invention.

Referring to FIG. 5A, first material layers 411 and second material layers 413 may be alternately formed over a substrate (not illustrated). The first material layers 411 may include a sacrificial material having a different etch selectivity from a conductive pattern material, and the second material layers 413 may include a conductive pattern material. More specifically, the first material layers 411 may include an undoped polysilicon layer, and the second material layers 413 may include a doped polysilicon layer.

Subsequently, first slits 417 may be formed through the first and second material layers 411 and 413 so as to separate the first and second material layers 411 and 413 into first preliminary stacked structures.

Subsequently, the first slits 417 may be filled with third material layers 419. The third material layers 419 may include a material having a different etch selectivity from the second material layers 413 and a support body material layer 421 to be formed subsequently. More specifically, the third material layers 419 may include the same material as the first material layers 411.

Subsequently, a support body 421A and fourth material layers 431 and fifth material layers 433 may be formed over the first to third material layers 411, 413 and 419. The support body 421A may include holes, arranged along the first slits 417. The fourth material layers 431 and fifth material layers 433 may be alternately stacked over the support body 421A.

Second slits 437, which are arranged along the first slits 417, may pass through the fourth material layers 431 and the fifth material layers 433.

The support body 421A may include different materials from the first to third material layers 411, 413 and 419. More specifically, the support body material layer 421 may include a silicon oxide layer.

The fourth material layers 431 may include the same material as the first material layers 411, and the fifth material layers 433 may include the same material as the second material layers 413.

Through holes 439 may be formed through the fourth material layers 431, the fifth material layers 433, the support body 421A, the first material layers 411 and the second material layers 413. Penetrating structures 445 that include thin films 441 and channel layers 443 may be formed in the through holes 439.

Holes of the support body 421A, the second slits 437, the through holes 439 and the penetrating structures 445 may be formed using the processes described above with reference to FIG. 2C to 2G or the processes described above with reference to FIG. 4.

Referring to FIG. 5B, the first slits 417 may be opened by removing the third material layers 419 opened through the second slits 437, and recessed regions may be formed by removing the first and fourth material layers 411 and 431. When the first and fourth material layers 411 and 431 and the third material layers 419 include the same material as each other, a process of opening the first slits 417 and a process of forming the recessed regions may be performed using the same etch process.

Subsequently, the second slits 437, the holes of the support body 421A, the first slits 417 and the recessed regions may be filled with an insulating material 471.

Figure 6:
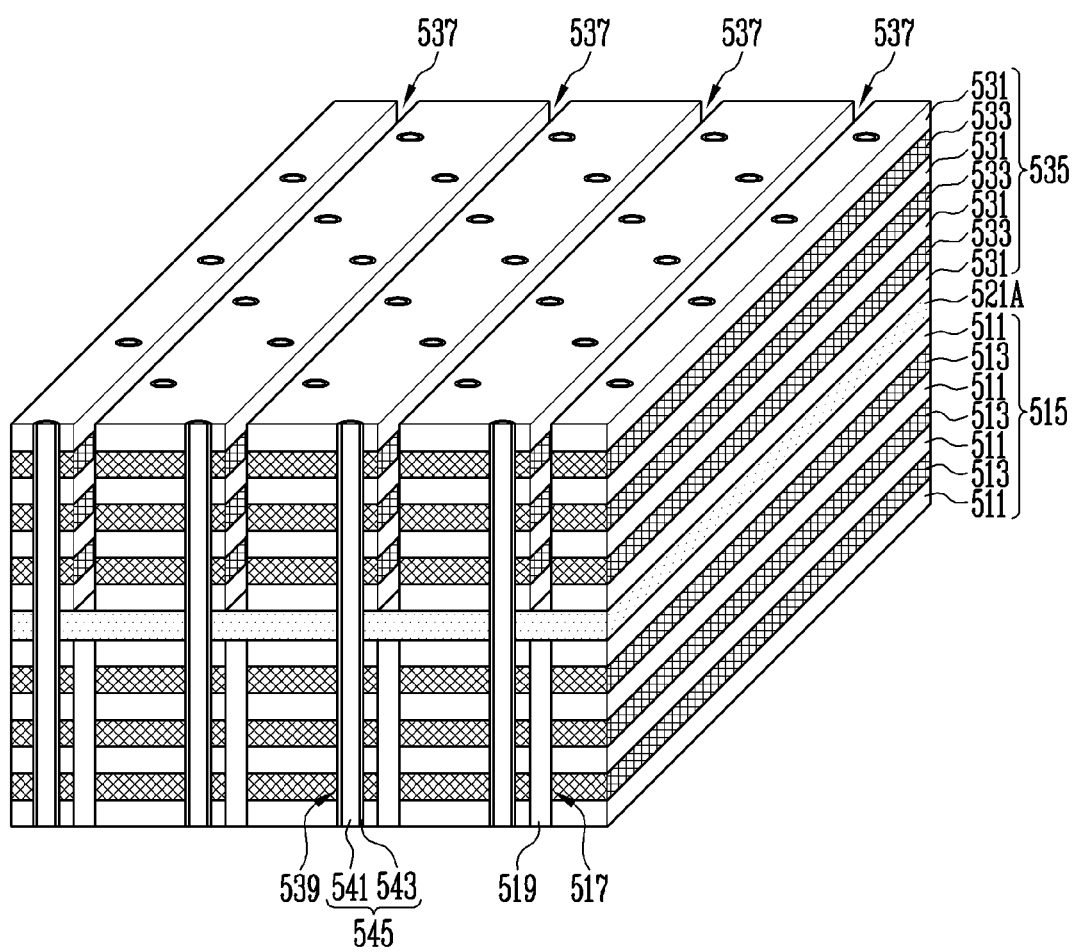
FIG. 6 is a perspective view illustrating a method of manufacturing a semiconductor device according to an embodiment of the present invention.

FIG. 6 is a perspective view illustrating a method of manufacturing a semiconductor device according to an embodiment of the present invention.

Referring to FIG. 6, first material layers 511 and second material layers 513 may be alternately formed over a substrate (not illustrated). The first material layers 511 may include an insulating pattern material, and the second material layers 513 may include a conductive pattern material. More specifically, the first material layers 511 may include a silicon oxide layer, and the second material layers 513 may include a conductive layer, such as a silicon layer, a metal layer, or a metal silicide layer.

Subsequently, first slits 517 may be formed through the first and second material layers 511 and 513 so as to separate the first and second material layers 511 and 513 into first preliminary stacked structures.

Thereafter, the first slits 517 may be filled with third material layers 519. The third material layers 519 may include an insulating material such as a silicon oxide layer.

Subsequently, a support body 521A, fourth material layers 531 and fifth material layers 533 may be formed over the first to third material layers 511, 513 and 519. The support body 521A may include holes that are arranged along the first slits 517. Second slits 537, which are arranged along the first slits 517, may be formed through the fourth material layers 531 and the fifth material layers 533. The fourth material layers 531 and the fifth material layers 533 may be alternately stacked over the support body 521A.

The support body 521A may include different materials from the first to third material layers 511, 513 and 519. For example, the support body material layer 521 may include a silicon nitride layer.

The fourth material layers 531 may include the same material as the first material layers 511, and the fifth material layers 533 may include the same material as the second material layers 513.

Through holes 539 may be formed through the fourth material layers 531, the fifth material layers 533, the support body 521A, the first material layers 511 and the second material layers 513. Penetrating structures 545 that include thin films 541 and channel layers 543 may be formed in the through holes 539.

The holes of the support body 521A, the second slits 537, the through holes 539 and the penetrating structures 545 may be formed using the processes described above with reference to FIG. 2C to 2G or the processes described in FIG. 4.

Subsequently, though not illustrated in FIG. 6, an insulating material with which the second slits 437 and the holes of the support body 421A are filled may be formed over the third material layers 419 opened through the second slits 537.

Figure 7:
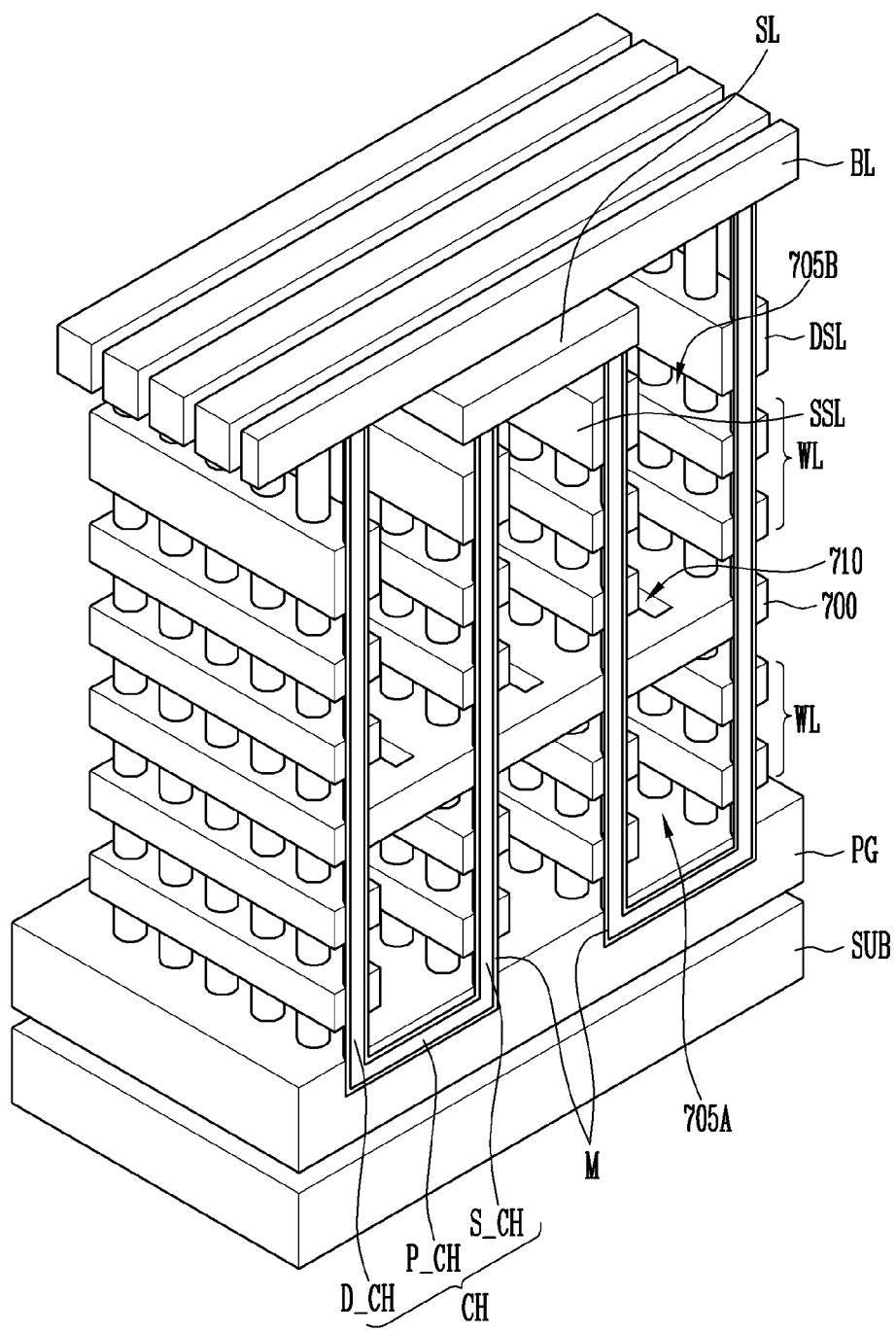
FIGS. 7 and 8 are perspective views illustrating cells structures of a semiconductor device according to an embodiment of the present invention.
Figure 8:
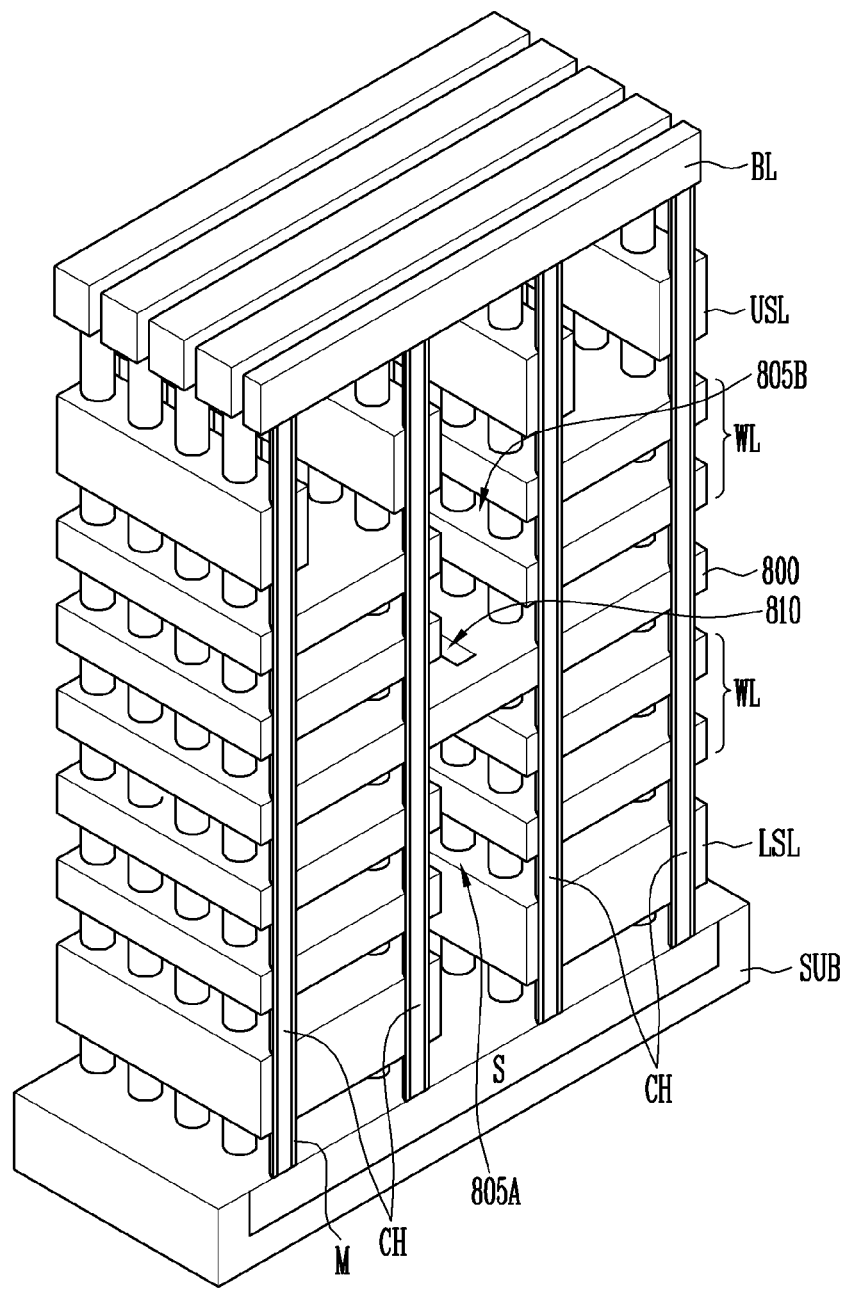

FIGS. 7 and 8 are perspective views illustrating cell structures of a semiconductor device according to an embodiment of the present invention. However, an insulating layer is not shown for illustrative purposes.

FIG. 7 illustrates an example in which channel layers CH have a U shape.

As illustrated in FIG. 7, a cell structure may include a pipe gate PG, word lines WL, at least one drain selection line DSL, at least source selection line SSL and a support body 700 that are stacked over a substrate SUB. The word lines WL, the drain selection line DSL and the source selection line SSL correspond to the conductive patterns 113 and 133 shown in FIG. 1. The word lines WL, the drain selection line DSL and the source selection line SSL may be stacked under or over the support body 700 and separated by slits 705A and 705B. The support body 700 may include holes 710 that are arranged in a direction in which the slits 705A and 705B extend.

The cell structure may further include channel layers CH having a U shape. The channel layers CH may include a pipe channel layer P_CH that is formed in the pipe gate PG and source and drain side channel layers S_CH and D_CH that are coupled to the pipe channel layer P_CH. The source and drain side channel layers S_CH and D_CH correspond to the channel layers 143 shown in FIG. 1.

The source side channel layers S_CH may pass through the word lines WL, the support body 700 and the source selection line SSL. The drain side channel layers D_CH may pass through the word lines WL, the support body 700 and the drain selection line DSL. In addition, the source side channel layers S_CH may be coupled to a source line SL, and the drain side channel layers D_CH may be coupled to bit lines BL.

In addition, the semiconductor device may further include thin films M that surround the channel layers CH. Each of the thin films M may include at least one of a blocking insulating layer, a data storage layer and a tunnel insulating layer. For example, each of the thin films M may include a tunnel insulating layer surrounding a sidewall of each of the channel layers CH. Each of the thin films M may further include a data storage layer that surrounds each of the tunnel insulating layers. The thin film M may further include a blocking insulating layer that surrounds the data storage layer.

According to the above-described structure of the semiconductor structure, at least one drain selection transistor, memory cells and at least one source selection transistor that are coupled in series with each other may form a single string and be arranged in a U shape.

The cell structure of the semiconductor device, described with reference to FIG. 7, may be manufactured using the manufacturing method described above with reference to FIGS. 2A to 6, a detailed description thereof will be omitted. However, before the processes described above with reference to FIGS. 2A to 6 are performed to form the cell structure of the semiconductor device described with reference to 7, a process for forming the pipe gate PG and a process for forming a pipe hole in the pipe gate PG and filling the pipe hole with a sacrificial material in the pipe hole may be further formed. The sacrificial material in the pipe hole may be removed before the thin films M and the channel layers CH are formed. Thus, the thin films M and the channel layers CH may be formed in the pipe hole.

FIG. 8 is a view illustrating an example in which the channel layer CH has a straight shape vertical to a surface of the substrate SUB.

As illustrated in FIG. 8, a cell structure may include at least one lower selection line LSL, word lines WL, a support body 800 stacked between the word lines WL and at least one upper selection line USL that are sequentially stacked over the substrate SUB in which a source region 8 is formed. The word lines WL may be separated by slits 805A and 805B. At least one of the upper and lower selection lines USL and LSL may have a linear shape. The slits 805A and 805B by which the word lines WL are separated may extend to further separate at least one of the upper and lower selection lines USL and LSL. The word lines WL correspond to the conductive patterns 113 and 133 shown in FIG. 1 and may be stacked over or under the support body 800. The support body 800 may include holes 810 that are arranged in a direction in which the slits 805A and 805B extend.

The semiconductor device may further include channel layers CH that extend from the substrate SUB and pass through the lower selection line LSL, the word lines WL, the support body 800 and the upper selection lines USL. Upper ends of the channel layers CH may be coupled to the bit lines BL, and lower ends of the channel layers CH may be coupled to the source region S formed in the substrate SUB. The channel layers CH correspond to the channel layers 143 shown in FIG. 1.

In addition, the semiconductor device may further include the thin films M interposed between the channel layers CH and the word lines WL. A detailed configuration of the thin films M may be the same as described above with reference to FIG. 7.

According to the above-described structure of the semiconductor device, at least one lower selection transistor, memory cells and at least one upper selection transistor may form a single string and be arranged in a row.

Since the cell structure of the semiconductor device described above with reference to FIG. 8 may be manufactured using the manufacturing method described above with reference to FIGS. 2A to 6, a detailed description thereof will be omitted.

Figure 9:
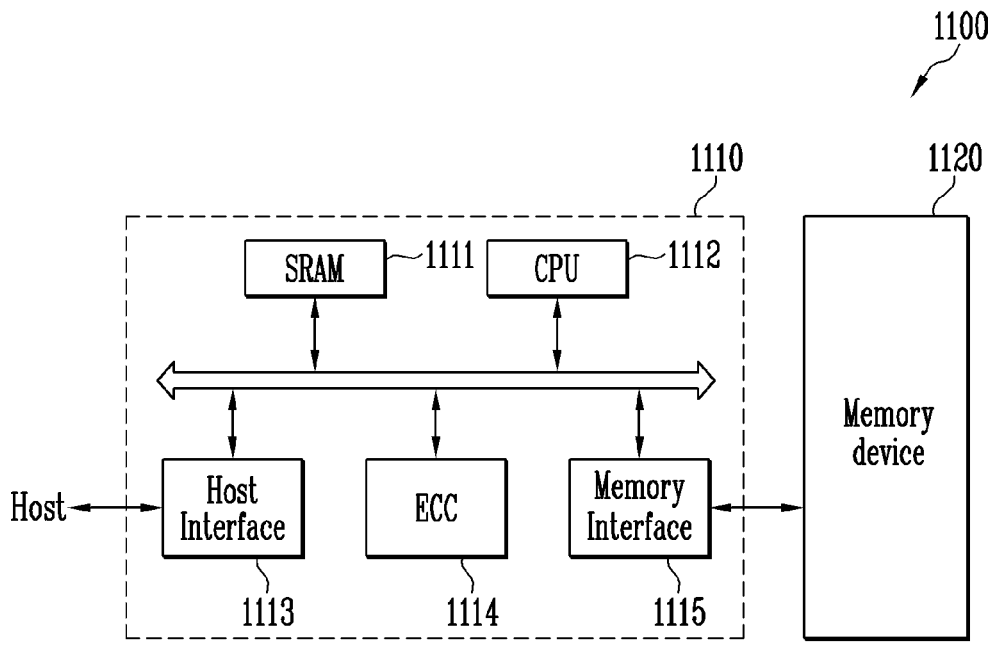
FIG. 9 is a view illustrating the configuration of a memory system according to an embodiment of the present invention.

FIG. 9 is a view illustrating the configuration of a memory system according to an embodiment of the present invention.

As illustrated in FIG. 9, a memory system 1100 according to an embodiment of the present invention may include a memory device 1120 and a memory controller 1110.

The memory device 1120 may have the structure according to the earlier embodiments described with reference to FIGS. 1 to 8. In addition, the memory device 1120 may be a multi-chip package composed of a plurality of flash memory chips.

The memory controller 1110 may be configured to control the memory device 1120. The memory controller 1110 may include SRAM 1111, a CPU 1112, a host interface 1113, an ECC 1114 and a memory interface 1115. The SRAM 1111 may function as an operation memory of the CPU 1112. The CPU 1112 may perform the general control operation for data exchange of the memory controller 1110. The host interface 113 may include a data exchange protocol of a host being coupled to the memory system 1100. In addition, the ECC 1114 may detect and correct errors included in a data read from the memory device 1120. The memory interface 1115 may interface with the memory device 1120. The memory controller 1110 may further include ROM that stores code data to interface with the host.

The memory system 1100 having the above-described configuration may be a solid state disk (SSD) or a memory card in which the memory device 120 and the memory controller 1110 are combined. For example, when the memory system 1100 is an SSD, the memory controller 1110 may communicate with an external device (e.g., a host) through one of the interface protocols including USB, MMC, PCI-E, SATA, PATA, SCSI, ESDI and IDE.

Figure 10:
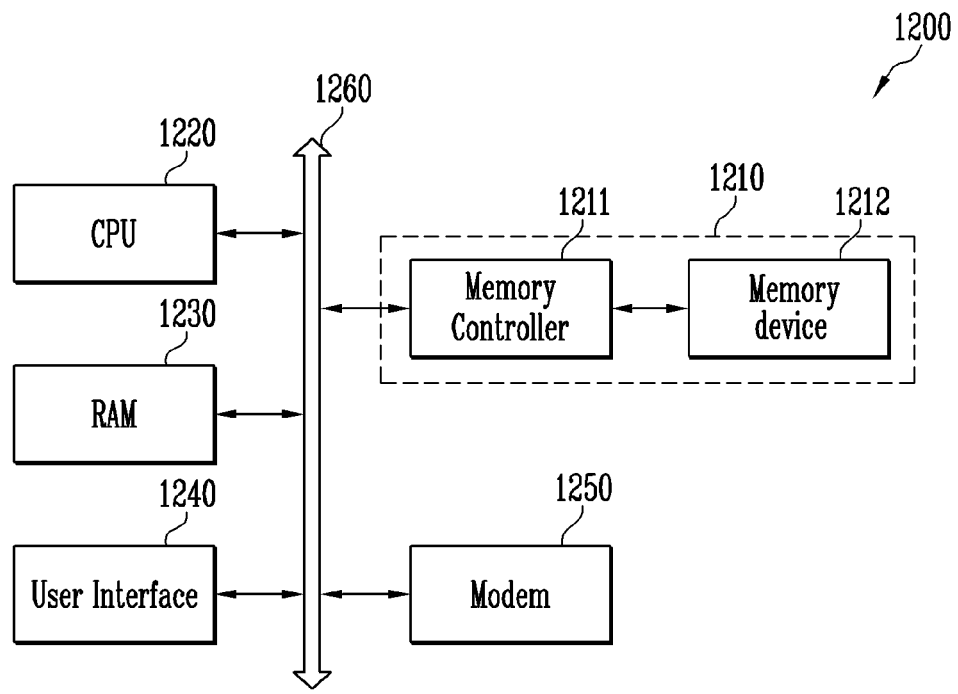
FIG. 10 is a view illustrating the configuration of a computing system according to an embodiment of the present invention.

FIG. 10 is a block diagram illustrating the configuration of a computing system according to an embodiment of the present invention.

As illustrated in FIG. 10, a computing system 1200 according to an embodiment of the present invention may include a CPU 1220, RAM 1230, a user interface 1240, a modem 1250 and a memory system 1210 that are electrically coupled to a system bus 1260. In addition, when the computing system 1200 is a mobile device, a battery may be further included to apply operating voltage to the computing system 1200. The computing system 1200 may further include application chipsets, a CMOS Image Sensor (CIS) and mobile DRAM.

As described above with reference to FIG. 9, the memory system 1210 may include a memory device 1212 and a memory controller 1211.

According to the invention, material layers stacked over a substrate are divided into stacked groups arranged in at least two tiers, and a support body is formed between the stacked groups, so that the stacked groups may be prevented from leaning. Therefore, reliability of a semiconductor device may be increased, and a manufacturing method thereof may become easier.

What is claimed is:

1. A semiconductor device, comprising:
   a first direction in a cross-section view and a second direction in a plan view, wherein the second direction is perpendicular to the first direction;
   first stacked groups each including first interlayer insulating patterns and first conductive patterns alternately stacked over a substrate in the first direction;
   second stacked groups each including second interlayer insulating patterns and second conductive patterns alternately stacked over the first stacked groups in the first direction;
   a plurality of channel layers passing through the first stacked group, a support body, and the second stacked group in the first direction;
   first slits located between the first stacked groups to completely separate the first stacked groups from each other in the second direction;
   second slits located between the second stacked groups to completely separate the second stacked groups from each other in the second direction; and
   the support body including holes arranged at a predetermined interval and overlapping the first and second slits, wherein the support body is formed between the first stacked groups and the second stacked groups in the first direction.

2. The semiconductor device of claim 1, wherein the support body includes any one of a conductive layer, a silicon oxide layer and a silicon nitride layer.

3. The semiconductor device of claim 1, wherein the support body contacts any one of the interlayer insulating patterns of each of the first and second stacked groups.

4. The semiconductor device of claim 1, wherein the first slits and the second slits are coupled through the holes.

5. The semiconductor device of claim 1, further comprising an insulating structure filling the first slits, the second slits and the holes.

6. The semiconductor device of claim 1, further comprising a source region formed in the substrate and coupled to the first channel layers.

7. The semiconductor device of claim 1, further comprising:
   a pipe channel layer coupling the first channel layers; and
   a pipe gate surrounding the pipe channel layer.

8. A semiconductor device, comprising:
   a first direction in a cross-section view and a second direction in a plan view, wherein the second direction is perpendicular to the first direction;
   first stacked groups each including first interlayer insulating patterns and first conductive patterns alternately stacked in the first direction;
   first slits located between the first stacked groups to completely separate the first stacked groups from each other in the second direction;
   second stacked groups located on the first stacked groups and each including second interlayer insulating patterns and second conductive patterns alternately stacked in the first direction;
   second slits located between the second stacked groups to completely separate the second stacked groups from each other in the second direction; and
   a support body interposed between the first stacked groups and the second stacked groups, and including holes overlapping the first slits in the first direction.

9. The semiconductor device of claim 8, wherein each of the second slits overlaps each of the first slits.

10. The semiconductor device of claim 8, wherein the first and second slits extend in one direction and the holes are arranged in the one direction in which the first and second slits extend.

11. The semiconductor device of claim 8, wherein each of the first slits is coupled to each of the second slits through the holes of the support body.

12. A semiconductor device, comprising:
   a first direction in a cross-section view and a second direction in a plan view, wherein the second direction is perpendicular to the first direction;
   a first structure;
   first slits passing through the first structure, extending in one direction, and completely separating each portion of the first structure in the second direction;
   a second structure located over the first structure in the first direction;
   second slits passing through the second structure and completely separating each portion of the second structure in the second direction; and
   a support body interposed between the first structure and the second structure, and including a plurality of holes separated from each other in the first direction,
   wherein one of the first slits overlaps the plurality of holes.

13. The semiconductor device of claim 12, wherein each of the second slits overlaps each of the first slits.

14. The semiconductor device of claim 12, wherein the first structure includes first stacked groups separated from each other by the first slits, and each of the first stacked groups includes first interlayer insulating patterns and first conductive patterns alternately stacked.

15. The semiconductor device of claim 12, wherein the second structure includes second stacked groups separated from each other by the second slits, and each of the second stacked groups includes second interlayer insulating patterns and second conductive patterns alternately stacked.

\* \* \* \* \*